United States Patent
Kodama et al.

(10) Patent No.: US 8,609,303 B2
(45) Date of Patent: Dec. 17, 2013

(54) MASK PATTERN GENERATING METHOD AND COMPUTER PROGRAM PRODUCT

(75) Inventors: Chikaaki Kodama, Kanagawa (JP); Toshiya Kotani, Tokyo (JP); Hiromitusu Mashita, Kanagawa (JP); Fumiharu Nakajima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 13/237,651

(22) Filed: Sep. 20, 2011

(65) Prior Publication Data

US 2012/0183906 A1   Jul. 19, 2012

(30) Foreign Application Priority Data

Jan. 13, 2011  (JP) .................................. 2011-005177

(51) Int. Cl.
  *G03F 1/38*   (2012.01)
  *G03F 1/68*   (2012.01)
(52) U.S. Cl.
  USPC .............................................. 430/5; 430/394
(58) Field of Classification Search
  USPC .................... 430/5, 30, 394; 716/52
  See application file for complete search history.

(56) References Cited

U.S. PATENT DOCUMENTS

| 7,424,699 | B2 | 9/2008 | O'Brien |
| 7,998,642 | B2 | 8/2011 | Kodama et al. |
| 2003/0165750 | A1* | 9/2003 | Tanaka et al. ..................... 430/5 |
| 2008/0301620 | A1 | 12/2008 | Ye et al. |

FOREIGN PATENT DOCUMENTS

| JP | 2007-065246 | 3/2007 |
| JP | 2007-225924 | 9/2007 |

OTHER PUBLICATIONS

Kodama et al.; "Sub-Resolution Assist Feature Arranging Method and Computer Program Product and Manufacturing Method of Semiconductor Device", U.S. Appl. No. 13/051,961, filed Mar. 18, 2011.

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

According to a mask pattern generating method of the embodiments, an undesired pattern, which is transferred onto a substrate due to an auxiliary pattern when an on-substrate pattern is formed on the substrate by using a mask pattern in which the auxiliary pattern is placed, is extracted as an undesired transfer pattern. Then, the mask pattern is corrected by changing a size of the auxiliary pattern according to a size and a position of the undesired transfer pattern.

10 Claims, 8 Drawing Sheets

MASK PATTERN GENERATING METHOD AND COMPUTER PROGRAM PRODUCT

CROSS-REFERENCE TO RELATED APPLICATIONS

This application is based upon and claims the benefit of priority from the prior Japanese Patent Application No. 2011-005177, filed on Jan. 13, 2011; the entire contents of which are incorporated herein by reference.

FIELD

The present embodiments typically relate to a mask pattern generating method, a manufacturing method of a semiconductor device, and a computer program product.

BACKGROUND

Conventionally, as one method of improving a lithography margin of an exposure pattern (main pattern) in the semiconductor lithography technology, there is a layout design using auxiliary patterns (SRAF: Sub-Resolution Assist Feature).

When generating a mask pattern, SRAFs are desirably placed around a main pattern in a state where the SRAFs are not transferred onto a substrate when performing a lithography process. Moreover, SRAFs are desirably placed in a short time while improving a lithography margin as much as possible.

DETAILED DESCRIPTION

According to embodiments, a mask pattern generating method is provided. In the mask pattern generating method, an undesired pattern, which is transferred onto a substrate due to an auxiliary pattern when an on-substrate pattern is formed on the substrate by using a mask pattern in which the auxiliary pattern is placed, is extracted as an undesired transfer pattern. Then, the mask pattern is corrected by changing a size of the auxiliary pattern according to a size and a position of the undesired transfer pattern.

A mask pattern generating method, a manufacturing method of a semiconductor device, and a computer program product according to the embodiments will be explained below in detail with reference to the accompanying drawings. The present invention is not limited to these embodiments.

First Embodiment

Figure 1:
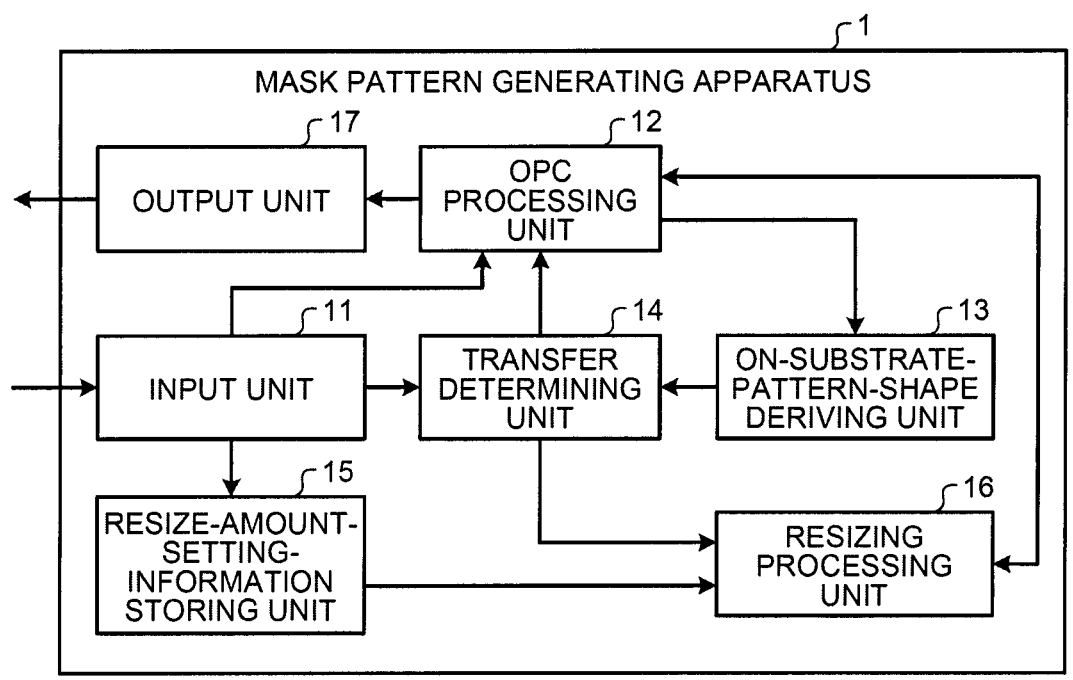
FIG. 1 is a block diagram illustrating a configuration of a mask pattern generating apparatus according to a first embodiment.

FIG. 1 is a block diagram illustrating a configuration of a mask pattern generating apparatus according to the first embodiment. A mask pattern generating apparatus 1 according to the present embodiment is an apparatus, such as a computer, that generates a mask pattern, with which a desired on-substrate pattern can be formed, by correcting the size of an auxiliary pattern (SRAF). In the present embodiment, for eliminating unnecessary pattern transfer due to an SRAF, the SRAF is resized little by little in a range in which a necessary lithography margin can be ensured. Then, finally, a mask pattern is generated in which a necessary lithography margin is maintained while minimizing resizing of an SRAF and occurrence of unnecessary pattern transfer due to an SRAF is prevented.

An SRAF is a pattern used in the photolithography process when manufacturing a semiconductor device (semiconductor integrated circuit). Specifically, an SRAF is an on-mask pattern that is not transferred onto a substrate such as a wafer and is an auxiliary pattern (pattern that is originally not resolved) of a size less than the limiting resolution at the time of substrate transfer. An SRAF is placed near a main pattern such as a circuit pattern to be transferred onto a substrate.

When generating a mask pattern used in the lithography process of a semiconductor device, a lithography target (main pattern) is generated by using design layout pattern data (hereinafter, layout pattern L). Then, an SRAF is placed near the lithography target to improve a lithography margin of the main pattern. Thereafter, the OPC (Optical Proximity Correction) process is performed on a mask pattern layout (pre-OPC mask pattern) in which the SRAF is placed to generate a mask pattern. The mask pattern generating apparatus 1 in the present embodiment resizes an SRAF so that a pattern (hereinafter, undesired transfer pattern) due to the SRAF is not transferred onto a substrate when an on-substrate pattern is formed on the substrate by using the generated mask pattern. An undesired transfer pattern is a transfer pattern (undesired pattern) other than a desired on-substrate pattern.

The mask pattern generating apparatus 1 includes an input unit 11, an OPC processing unit 12, an on-substrate-pattern-shape deriving unit 13, a transfer determining unit 14, a resize-amount-setting-information storing unit 15, a resizing processing unit 16, and an output unit 17.

The input unit 11 inputs the layout pattern L from an external apparatus (such as a layout-pattern-data generating apparatus) and sends it to the OPC processing unit 12 and the transfer determining unit 14. Moreover, the input unit 11 inputs information (hereinafter, resize amount setting information) in which an SRAF resize amount according to an undesired transfer pattern is set and sends it to the resize-amount-setting-information storing unit 15. The resize amount setting information is a resize amount of an SRAF set according to the size of an undesired transfer pattern, the distance from an undesired transfer pattern, and the like. For example, when an undesired transfer pattern is small, the resize amount is set small, and when an undesired transfer pattern is large, the resize amount is set large.

The OPC processing unit 12 generates a mask pattern M0 (not shown) by performing the OPC on the layout pattern L. Moreover, when a mask pattern layout (pre-OPC mask pattern in which a resized SRAF is placed) in which an SRAF is resized m times (m is an integer of 0 or greater) is sent from the resizing processing unit 16, the OPC processing unit 12 generates a new mask pattern Mm by performing the OPC on this mask pattern layout. The OPC processing unit 12 sends the generated mask pattern to the on-substrate-pattern-shape deriving unit 13 as the mask pattern Mm.

The on-substrate-pattern-shape deriving unit 13 derives an on-substrate pattern (resist pattern shape) to be patterned onto a substrate by performing a lithography simulation by using the mask pattern Mm generated in the OPC processing unit 12. The on-substrate-pattern-shape deriving unit 13 sends the derived on-substrate pattern to the transfer determining unit 14.

The transfer determining unit 14 determines whether an undesired transfer pattern is included in the on-substrate pattern based on the layout pattern L and the on-substrate pattern derived by the transfer determining unit 14. When an undesired transfer pattern is included in the on-substrate pattern, the transfer determining unit 14 obtains the position, the size, and the like of the undesired transfer pattern from the on-substrate pattern as undesired transfer pattern information. When there is no undesired transfer pattern, the transfer determining unit 14 causes the mask pattern Mm to be transmitted from the OPC processing unit 12 to the output unit 17.

Moreover, when there is an undesired transfer pattern, the transfer determining unit 14 sends the undesired transfer pattern information to the resizing processing unit 16, and causes the layout pattern L and the mask pattern Mm to be transmitted from the OPC processing unit 12 to the resizing processing unit 16. When there is only an undesired transfer pattern of a predetermined allowable size or less, the transfer determining unit 14 may determine that the undesired transfer pattern is within an allowable range (no undesired transfer pattern).

The resize-amount-setting-information storing unit 15 is, for example, a memory that stores the resize amount setting information sent from the input unit 11. The resizing processing unit 16 determines the resize amount (SRAF resize amount) of SRAFs for each SRAF based on the resize amount setting information, the undesired transfer pattern information, and the layout pattern L. The resizing processing unit 16 resizes each SRAF in the mask pattern layout corresponding to the mask pattern Mm by the determined SRAF resize amount. The mask pattern Mm in this example is a mask pattern in which SRAFs are resized m times. The resizing processing unit 16 sends the mask pattern in which SRAFs are resized to the OPC processing unit 12 as a mask pattern M(m+1). The output unit 17 outputs the mask pattern M(m+1) sent from the OPC processing unit 12 to an external apparatus or the like as needed.

Figure 2:
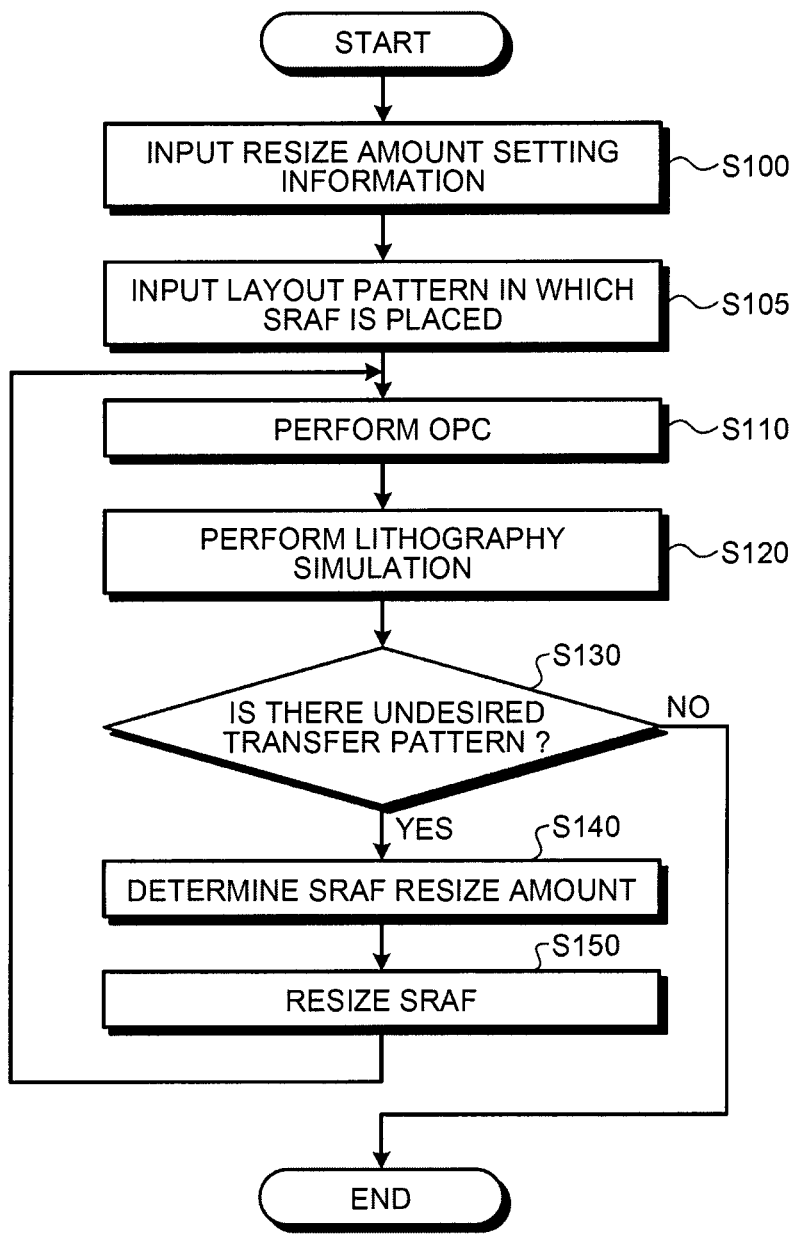
FIG. 2 is a flowchart illustrating a process procedure of a mask pattern generating process according to the first embodiment.

FIG. 2 is a flowchart illustrating a process procedure of a mask pattern generating process according to the first embodiment. The resize amount setting information is input to the input unit 11 of the mask pattern generating apparatus 1 and is stored in the resize-amount-setting-information storing unit 15 in advance (Step S100).

Figure 3:
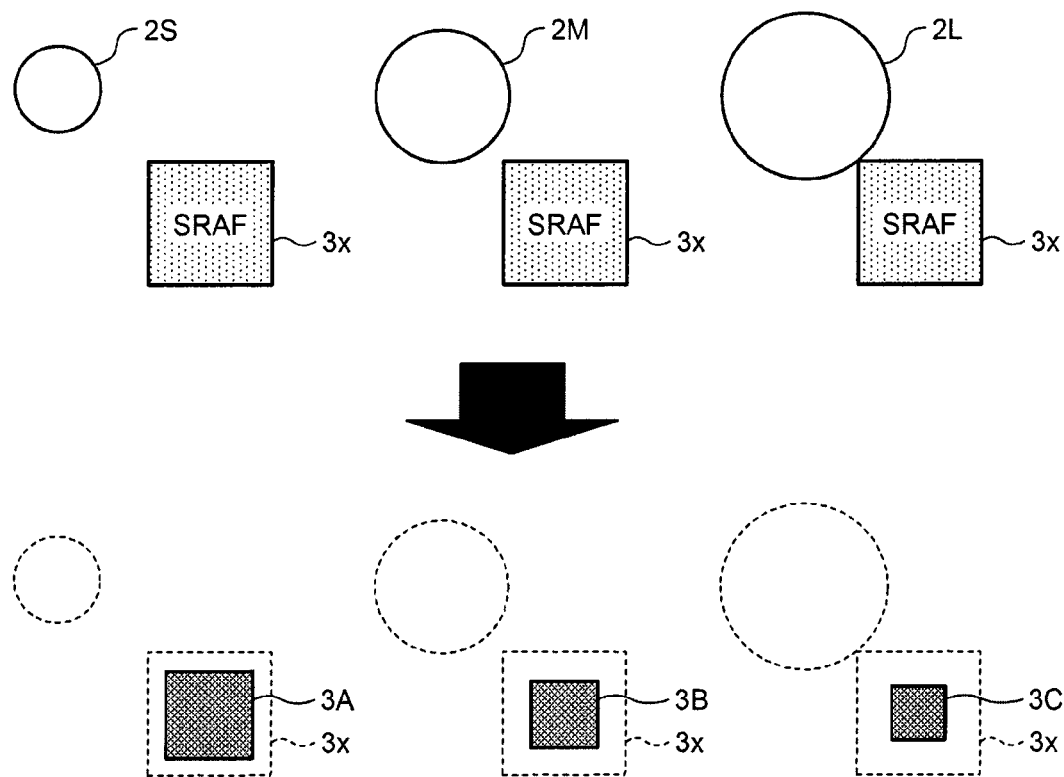
FIG. 3 is a diagram for explaining an SRAF resize amount set for each size of an undesired transfer pattern.

The resize amount setting information is information generated by a user or the like in advance according to the size of an undesired transfer pattern, the distance of an SRAF from an undesired transfer pattern, and the like. FIG. 3 is a diagram for explaining an SRAF resize amount set for each size of an undesired transfer pattern. The SRAF resize amount (amount of reduction) of an SRAF 3× is set based on the size (area) of an undesired transfer pattern obtained by an experimental result or the like. For example, based on an experimental result, each size of an undesired transfer pattern that needs a small amount of resizing of an SRAF, an undesired transfer pattern that needs a moderate amount of resizing of an SRAF, and an undesired transfer pattern that needs a large amount of resizing of an SRAF is derived in advance. Then, setting of grouping of undesired transfer patterns is performed in advance based on the sizes of the derived undesired transfer patterns. In other words, the size of an undesired transfer pattern to be classified into each group is obtained in advance.

For example, a small SRAF resize amount is set for a small undesired transfer pattern 2S. This is because when an undesired transfer pattern is small, the undesired transfer pattern disappears with a high probability by resizing the SRAF 3× by a small amount.

A large SRAF resize amount is set for a large undesired transfer pattern 2L. This is because when an undesired transfer pattern is large, the undesired transfer pattern does not disappear with a high probability unless the SRAF 3× is resized by a large amount.

A moderate SRAF resize amount is set for an undesired transfer pattern 2M (moderate undesired transfer pattern) between the small undesired transfer pattern 2S and the large undesired transfer pattern 2L.

The size of each of the undesired transfer patterns 2S to 2L in this example is a range of an area. For example, when an area S of an undesired transfer pattern is larger than zero and equal to or smaller than a ($0 < S \leq a$), the undesired transfer pattern is set as the small undesired transfer pattern 2S. When the area S of an undesired transfer pattern is larger than a and equal to or smaller than b ($a < S \leq b$), the undesired transfer pattern is set as the moderate undesired transfer pattern 2M. When the area S of an undesired transfer pattern is larger than b ($b < S$), the undesired transfer pattern is set as the large undesired transfer pattern 2L.

A small SRAF resize amount (for example, 1 nm) is set for the small undesired transfer pattern 2S, so that the SRAF 3× placed near the small undesired transfer pattern 2S is resized a little. Consequently, the SRAF 3× is resized (corrected) to an SRAF 3A that is a little smaller than the SRAF 3×.

A large SRAF resize amount (for example, 5 nm) is set for the large undesired transfer pattern 2L, so that the SRAF 3× placed near the large undesired transfer pattern 2L is resized by a large amount. Consequently, the SRAF 3× is resized to an SRAF 3C that is much smaller than the SRAF 3×.

A moderate SRAF resize amount (for example, 3 nm) is set for the moderate undesired transfer pattern 2M, so that the SRAF 3× placed near the moderate undesired transfer pattern 2M is resized by a moderate amount. Consequently, the SRAF 3× is resized to an SRAF 3B that is larger than the SRAF 3A and is smaller than the SRAF 3C.

The number of the ranges of the size of an undesired transfer pattern may be two (large and small) or may be four or more. The SRAF resize amount may be calculated for each size of an undesired transfer pattern by using a predetermined calculation equation. The SRAF resize amount may be a resize dimension according to the size of an undesired transfer pattern or a resize rate according to the size of an undesired transfer pattern.

For example, when the resize dimension is set for the SRAF resize amount, the SRAF resize amounts in the cases of the undesired transfer patterns 2S, 2M, and 2L are set to R1 (nm), R2 (nm), and R3 (nm) (R1<R2<R3), respectively. Consequently, the peripheral portions of the SRAFs 3× placed near the undesired transfer patterns 2S, 2M, and 2L are reduced by R1, R2, and R3, respectively to be the SRAFs 3A, 3B, and 3C.

When the resize rate is set for the SRAF resize amount, the SRAF rates in the cases of the undesired transfer patterns 2S, 2M, and 2L are set to R4 (%), R5 (%), and R6 (%) (R4<R5<R6), respectively. Consequently, the SRAFs 3× placed near the undesired transfer patterns 2S, 2M, and 2L are reduced by R4 (%), R5 (%), and R6 (%), respectively to be the SRAFs 3A, 3B, and 3C.

In this manner, the resize amount of the SRAF 3x in one loop is determined according to the size of an undesired transfer pattern based on which the SRAF 3x is selected as a resize target. Consequently, resizing of an SRAF with high accuracy can be realized.

The SRAF resize amount is set within a range in which a necessary lithography margin can be ensured. In other words, an SRAF is resized within a range in which NILS (normalized image log slope) can be improved. For example, a minimum SRAF size, with which a necessary lithography margin can be ensured, is checked in advance. In the mask pattern generating apparatus 1, an SRAF is resized so that the resized SRAF does not become smaller than the minimum SRAF size. The minimum SRAF size is, for example, stored in the resize amount setting information.

The SRAF 3x to be a resize target among the SRAFs 3x is the SRAF 3x in a predetermined range from the position of the undesired transfer patterns 2S to 2L. This predetermined range may be a certain range with respect to all of the undesired transfer patterns 2S to 2L or a range according to the size of each of the undesired transfer patterns 2S to 2L. Explanation is given for the case of setting a resize target region (target region of SRAF resizing) according to the size of each of the undesired transfer patterns 2S to 2L.

Figure 4A:
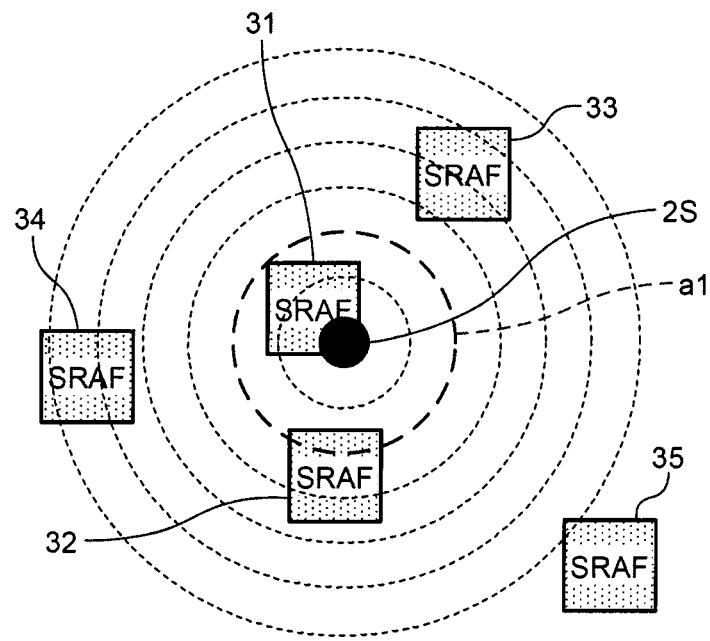
FIG. 4A and FIG. 4B are diagrams for explaining a resize target region set for each distance from an undesired transfer pattern.
Figure 4B:
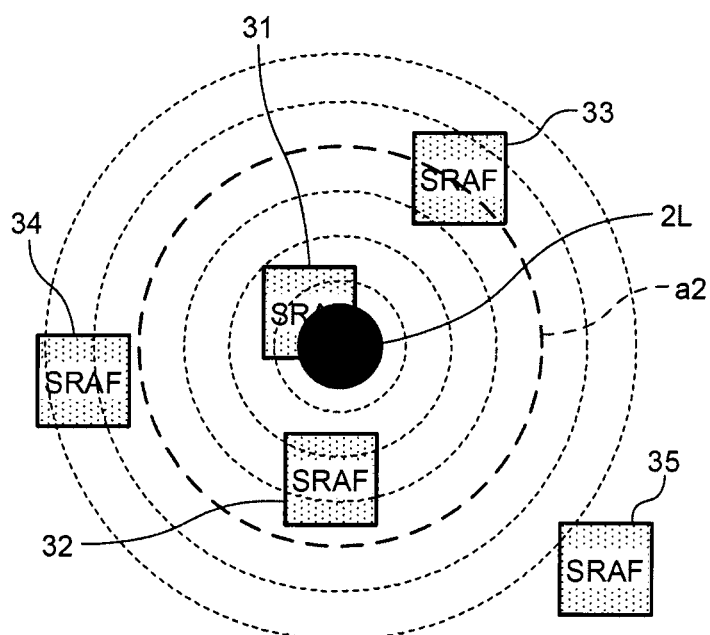

FIG. 4A and FIG. 4B are diagrams for explaining a resize target region set for each distance from an undesired transfer pattern. In FIG. 4A and FIG. 4B, the case is explained in which SRAFs 31, 32, 33, 34, and 35 are placed as the SRAFs 3x in increasing order of distance from the undesired transfer patterns 2S and 2L. The SRAF 3x to be a resize target is, for example, set based on the distance from the undesired transfer patterns 2S and 2L.

For example, for the small undesired transfer pattern 2S shown in FIG. 4A, the SRAFs 3x that are close to the small undesired transfer pattern 2S are set as resize targets. This is because, when an undesired transfer pattern is small, the undesired transfer pattern 2S disappears with a high probability by resizing the SRAFs 3x near the undesired transfer pattern.

For the large undesired transfer pattern 2L shown in FIG. 4B, the SRAF 3x that is close to the large undesired transfer pattern 2L and the SRAFs 3x that are far from the large undesired transfer pattern 2L are set as resize targets. This is because, when an undesired transfer pattern is large, the undesired transfer pattern 2L does not disappear with a high probability unless even the SRAF 3x far from the undesired transfer pattern is resized.

FIG. 4A illustrates the case of setting a narrow regional a1 (circular region in which the distance from its center is short) as a resize target region corresponding to the small undesired transfer pattern 2S. For example, among the SRAFs 3x, the SRAF 3x included even in part in the regional is set as a resize target. In this example, at least part of each of the SRAFs 31 and 32 is included in the regional. Therefore, the SRAFs 31 and 32 are set as resize targets for the small undesired transfer pattern 2S.

FIG. 4B illustrates the case of setting a broad region a2 (circular region in which the distance from its center is long) as a resize target region corresponding to the large undesired transfer pattern 2L. For example, among the SRAFs 3x, the SRAF 3x included even in part in the region a2 is set as a resize target. In this example, at least part of each of the SRAFs 31 to 33 is included in the region a2. Therefore, the SRAFs 31 to 33 are set as resize targets for the large undesired transfer pattern 2L.

In this manner, a predetermined range according to the size of an undesired transfer pattern is set as a resize target region. This is because, when the SRAF 3x is resized in a direction in which an undesired transfer pattern becomes small, a lithography margin of a main pattern typically decreases and therefore, the SRAF 3x that does not need to be corrected is desirably left without being resized. In the case of the large undesired transfer pattern 2L, only the SRAF 3x is selected within a narrow resize target region unless the resize target region is set large. In this case, the SRAF 3x selected in the narrow resize target region needs to be resized by a large amount. Therefore, even if the SRAF 3x is made small to the limit of mask constraints, the large undesired transfer pattern 2L may not disappear. Thus, in the present embodiment, the selection range of the SRAF 3x to be a resize target region is changed according to the size of an undesired transfer pattern.

The number of the ranges of a resize target region may be two (large and small) or four or more. The area of a resize target region may be calculated for each size of an undesired transfer pattern by using a predetermined calculation equation.

In this example, when the whole or part of the SRAF 3x is included in a resize target region, this SRAF 3x is set as a resize target, however, the positional relationship between the SRAF 3x to be a resize target and a resize target region is not limited thereto.

Figure 5A:
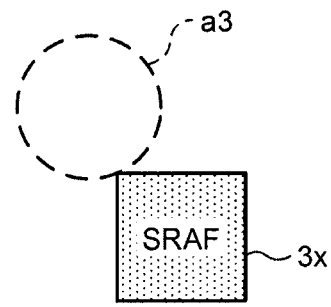
FIG. 5A to FIG. 5C are diagrams for explaining a positional relationship between an SRAF to be a resize target and a resize target region.
Figure 5B:
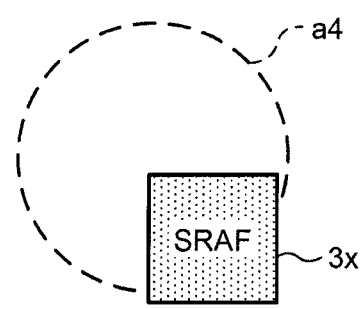
Figure 5C:
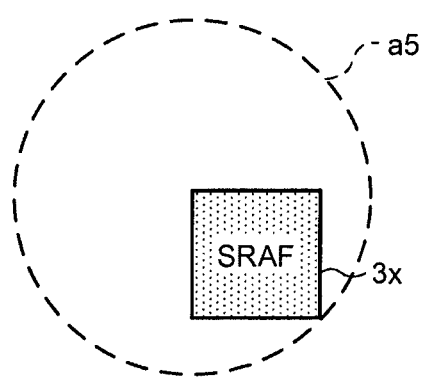

FIG. 5A to FIG. 5C are diagrams for explaining the positional relationship between an SRAF to be a resize target and a resize target region. FIG. 5A illustrates a case where a region a3 is set as a resize target region and the SRAF 3x is in contact with the region a3. For example, when the SRAF 3x is in contact with the region a3, this SRAF 3x may be set as a resize target.

FIG. 5B illustrates a case where a region a4 is set as a resize target region and the SRAF 3x overlaps the region a4 only partially. For example, when the SRAF 3x overlaps the region a4 even partially, this SRAF 3x may be set as a resize target.

FIG. 5C illustrates a case where a region a5 is set as a resize target region and the whole SRAF 3x is included in the region a5. For example, when the whole SRAF 3x is included in the region a5, this SRAF 3x may be set as a resize target.

The resize amount of the SRAF 3x may be determined based on the position in a resize target region. For example, a large resize amount is set for the SRAF 3x close to the center in the resize target region and a small resize amount is set for the SRAF 3x far from the center in the resize target region.

The resize amount of the SRAF 3x may be determined based on the area of a portion in which the SRAF 3x overlaps a resize target region. For example, when the area of a portion in which the SRAF 3x overlaps a resize target region is large, a large resize amount is set, and when the area of a portion in which the SRAF 3x overlaps a resize target region is small, a small resize amount is set.

After storing the resize amount setting information in the resize-amount-setting-information storing unit 15, the input unit 11 inputs the layout pattern L, in which SRAFs are placed, from an external apparatus or the like (Step S105) and sends it to the OPC processing unit 12 and the transfer determining unit 14.

The SRAFs 3x placed in the layout pattern L are placed based on exposure conditions such as an illumination shape and a layout pattern corresponding to an on-substrate pattern that needs to be formed on a substrate. The SRAF placement in the layout pattern L may be performed by using a rule base or performed by using a model base. In the layout pattern L, SRAFs are placed, for example, to have a lithography margin as much as possible while satisfying mask constraints. An SRAF to be placed in the layout pattern L is, for example, an SRAF with which an undesired transfer pattern is not easily transferred onto a substrate.

The layout pattern shape in the layout pattern L may be a line pattern or a contact pattern. In the following explanation, the case is explained in which the layout pattern shape in the layout pattern L is a contact pattern.

The OPC processing unit 12 generates the mask pattern M0 by performing the OPC on the layout pattern L (Step S110). The OPC processing unit 12 sends the generated mask pattern M0 to the on-substrate-pattern-shape deriving unit 13.

The on-substrate-pattern-shape deriving unit 13 derives an on-substrate pattern by performing a lithography simulation by using the mask pattern M0 generated by the OPC processing unit 12 (Step S120). The on-substrate-pattern-shape deriving unit 13 sends the derived on-substrate pattern to the transfer determining unit 14.

The transfer determining unit 14 determines whether an undesired transfer pattern is included in the on-substrate pattern based on the layout pattern L and the on-substrate pattern derived by the transfer determining unit 14 (Step S130).

When an undesired transfer pattern is included in the on-substrate pattern (Yes at Step S130), the transfer determining unit 14 obtains the position, the size, and the like of the undesired transfer pattern as the undesired transfer pattern information from the on-substrate pattern. Then, the transfer determining unit 14 sends the obtained undesired transfer pattern information to the resizing processing unit 16 and causes the layout pattern L and the mask pattern M0 to be transmitted from the OPC processing unit 12 to the resizing processing unit 16.

The resizing processing unit 16 determines the first SRAF resize amount (first resize amount) for each SRAF based on the resize amount setting information, the undesired transfer pattern information, and the layout pattern L (Step S140). Specifically, the resizing processing unit 16 classifies undesired transfer patterns into groups depending on the size. For example, each undesired transfer pattern is classified into any one of the small undesired transfer pattern 2S (group of a small pattern), the moderate undesired transfer pattern 2M (group of a moderate pattern), and the large undesired transfer pattern 2L (group of a large pattern).

When an SRAF belongs to a plurality of groups, the resizing processing unit 16, for example, classifies the SRAF into a group in which the size of an undesired transfer pattern is larger (group of a larger SRAF resize amount).

The resizing processing unit 16 sets a resize target region according to the size of the classified undesired transfer pattern and extracts the SRAFs 3× to be resize targets based on the set resize target region. The shape of the resize target region is, for example, the shape similar to the shape of the undesired transfer pattern. In other words, a region obtained by expanding the undesired transfer pattern by a predetermined homothetic ratio is set as a resize target region.

The resizing processing unit 16 determines the first SRAF resize amount according to the size of an undesired transfer pattern with respect to each of the extracted SRAFs 3×. Then, the resizing processing unit 16 resizes each SRAF in the mask pattern layout corresponding to the mask pattern Mm by the determined first SRAF resize amount (Step S150). In this manner, in the present embodiment, only the size of an SRAF is corrected and the placed position is not changed.

The resizing processing unit 16 sends the mask pattern layout in which SRAFs are resized to the OPC processing unit 12 as a mask pattern (in this example, a mask pattern M1). Then, in the mask pattern generating apparatus 1, the processes at Steps S110 to S130 are repeated. In other words, the OPC processing unit 12 generates the mask pattern M(m+1) after the OPC by performing the OPC on the mask pattern layout corresponding to the mask pattern Mm (Step S110). In this manner, in the present embodiment, the OPC is performed only once in one loop. The on-substrate-pattern-shape deriving unit 13 derives an on-substrate pattern by performing a lithography simulation by using the mask pattern M0 after the OPC or the mask pattern M(m+1) after the OPC generated in the OPC processing unit 12 (Step S120). The transfer determining unit 14 determines whether an undesired transfer pattern is included in the on-substrate pattern based on the layout pattern L and the on-substrate pattern derived by the transfer determining unit 14 (Step S130).

In the mask pattern generating apparatus 1, the processes at Steps S140, S150, and S110 to S130 are repeated until there is no undesired transfer pattern included in the on-substrate pattern. For example, when an undesired transfer pattern is included in the on-substrate pattern derived by using the mask pattern Mm after the OPC (Yes at Step S130), the transfer determining unit 14 obtains new undesired transfer pattern information. Then, the resizing processing unit 16 determines the m-th SRAF resize amount (m-th resize amount) for each SRAF based on the resize amount setting information, the new undesired transfer pattern information, and the layout pattern L (Step S140). Then, the resizing processing unit 16 resizes each SRAF in the mask pattern Mm by the determined SRAF resize amount (Step S150).

Each of the first to (m+1)th resize amounts may be a different resize amount. For example, the (m+1)th resize amount may be set to X (%) of the m-th resize amount.

When an undesired transfer pattern is not included in the on-substrate pattern derived by using the mask pattern M0 or M(m+1) after the OPC (No at Step S130), the transfer determining unit 14 causes the mask pattern M0 or M(m+1) to be transmitted from the OPC processing unit 12 to the output unit 17. The output unit 17 outputs the mask pattern M0 or M(m+1) sent from the OPC processing unit 12 to an external apparatus or the like as needed.

After resizing by the determined SRAF resize amount, when the SRAF 3× after resizing becomes smaller than the minimum SRAF size, the resizing processing unit 16 ends the resizing process of the SRAF 3× without performing the resizing process of the SRAF 3×. In this manner, in the present embodiment, the sum of the resize amounts is set within a range capable of ensuring a lithography margin. When ending the resizing process of the SRAF 3×, the resizing processing unit 16 causes the latest mask pattern to be transmitted from the OPC processing unit 12 to the output unit 17.

FIG. 6A to FIG. 6D are diagrams for explaining the resizing process of SRAFs according to the size of an undesired transfer pattern. In FIG. 6A to FIG. 6D, main patterns are illustrated as contact patterns 4.

Figure 6A:
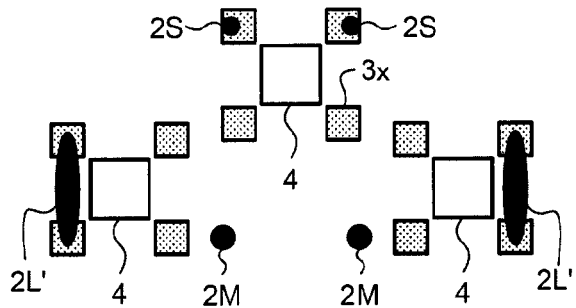
FIG. 6A to FIG. 6D are diagrams for explaining a resizing process of SRAFs according to the size of an undesired transfer pattern.

As shown in FIG. 6A, in the mask pattern generating apparatus 1, the resizing processing unit 16 performs grouping of undesired transfer patterns for each size. In this example, the case is illustrated in which undesired transfer patterns are classified into the small undesired transfer pattern 2S, the moderate undesired transfer pattern 2M, and a large undesired transfer pattern 2L'.

Figure 6B:
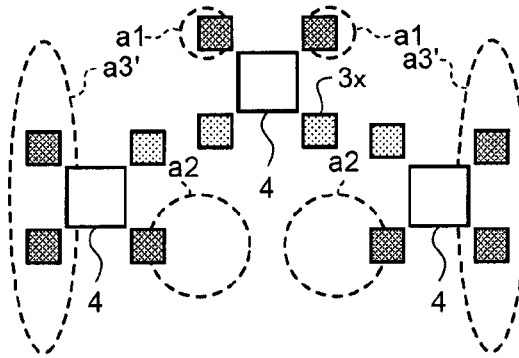

Thereafter, as shown in FIG. 6B, the resizing processing unit 16 selects resize target regions corresponding to each of the undesired transfer patterns 2S, 2M, and 2L'. This example illustrates the case where the regional is set as a resize target region corresponding to the undesired transfer pattern 2S, the region a2 is set as a resize target region corresponding to the undesired transfer pattern 2M, and a region a3' is set as a resize target region corresponding to the undesired transfer pattern 2L'. After setting the regions a1, a2, and a3', the resizing processing unit 16 selects the SRAFs 3× according to the regions a1, a2, and a3'.

Figure 6C:
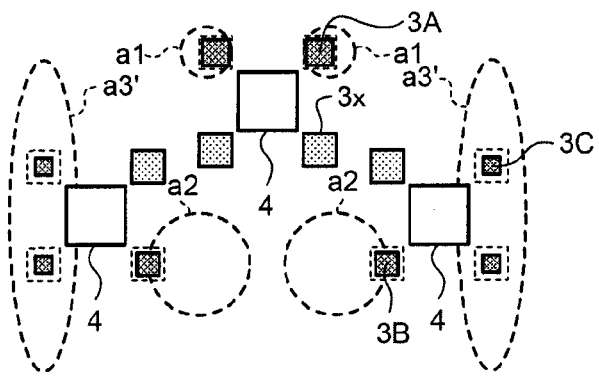

Thereafter, as shown in FIG. 6C, the resizing processing unit 16 resizes the selected SRAFs 3× for each of the regions a1, a2, and a3'. For example, the SRAF 3× corresponding to the regional is resized by a small amount to become the SRAF 3A. Moreover, the SRAF 3× corresponding to the region a2 is resized by a moderate amount to become the SRAF 3B. Furthermore, the SRAF 3× corresponding to the region a3' is resized by a large amount to become the SRAF 3C.

Figure 6D:
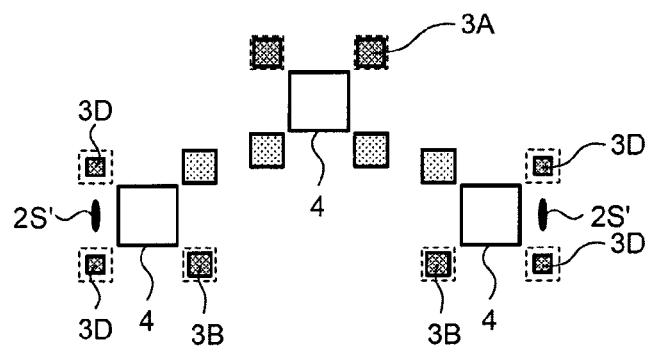

Thereafter, as shown in FIG. 6D, when an on-substrate pattern is formed by using a mask pattern after performing resizing of the SRAFs and the OPC process, if an undesired transfer pattern such as an undesired transfer pattern 2S' remains, the resizing processing unit 16 repeats the processes explained in FIG. 6A to FIG. 6C.

Generation of a mask pattern is performed, for example, for each layer in a wafer process. Then, a mask is generated by using the generated mask pattern and a semiconductor device is manufactured by using this mask. Specifically, exposure is performed on a wafer to which resist is applied by using the mask, and thereafter the wafer is developed to form a resist pattern on the wafer. Then, the lower layer side of the resist pattern is etched from above the resist pattern. Consequently, an actual pattern is formed on the wafer. When manufacturing a semiconductor device, the generation process of a layout pattern, the resizing process of an SRAF (generation process of a mask pattern), the generation process of a mask, an exposure process, a development process, an etching process, and the like are performed for each layer.

An SRAF can be made small until an undesired transfer pattern is not transferred by the process procedure explained in FIG. 2. Therefore, it is applicable that an SRAF, which is originally not transferred, is enlarged until it is transferred and thereafter, the SRAF is made small to the largest size with which it is transferred by the process procedure explained in FIG. 2. Consequently, the size of the SRAF can be made large to the largest size with which it is transferred. In other words, the SRAF of approximately the maximum size can be derived. Therefore, a lithography margin can be approximately maximized.

In the present embodiment, the mask pattern generating apparatus 1 is configured to include the OPC processing unit 12, the on-substrate-pattern-shape deriving unit 13, the transfer determining unit 14, and the resize-amount-setting-information storing unit 15, however, the configuration of the mask pattern generating apparatus 1 is not limited thereto. For example, the OPC processing unit 12, the on-substrate-pattern-shape deriving unit 13, the transfer determining unit 14, and the resize-amount-setting-information storing unit 15 may be configured separately from the mask pattern generating apparatus 1.

An on-substrate pattern derived by the on-substrate-pattern-shape deriving unit 13 may be a processed shape after performing processing such as etching from above a resist pattern. In this case, the on-substrate-pattern-shape deriving unit 13 derives an on-substrate pattern by performing a lithography simulation and a processing simulation by using a mask pattern. It is sufficient that the resize amount set in the resize amount setting information is set by the time undesired transfer patterns are classified into groups depending on the size.

In this manner, in the present embodiment, an SRAF is resized based on the size and the position of an undesired transfer pattern, so that a mask pattern can be generated by the OPC process of a small number of loops. In other words, because the OPC process is performed only once in one loop, a mask pattern can be generated in a short time. Moreover, an SRAF is resized to improve the NILS, so that the shape (for example, contact) of a main pattern can be prevented from collapsing. Furthermore, transfer of an SRAF can be removed so that a lithography margin does not decrease below a predetermined value while maintaining mask constraints, so that yield and reliability of chips (semiconductor devices) can be improved.

In this manner, according to the first embodiment, because an SRAF is resized based on the size and the position of an undesired transfer pattern, an undesired transfer pattern can easily disappear. Therefore, it is possible to easily generate a mask pattern with which a desired on-substrate pattern can be formed.

Second Embodiment

Next, the second embodiment of this invention is explained with reference to FIG. 7A to FIG. 7D and FIG. 8. In the second embodiment, SRAFs are resized by the same resize amount for each main pattern. In other words, resizing is performed on a plurality of SRAFs placed near one main pattern by the same resize amount.

FIG. 7A to FIG. 7D are diagrams for explaining the resizing process of SRAFs according to the second embodiment. Among the components in FIG. 7A to FIG. 7D, the components that perform the same function as those in the first embodiment shown in FIG. 6A to FIG. 6D are given the same numerals, and overlapping explanation is omitted. In FIG. 7A to FIG. 7D, the contact pattern 4 is illustrated as contact patterns 40 to 42.

Figure 7A:
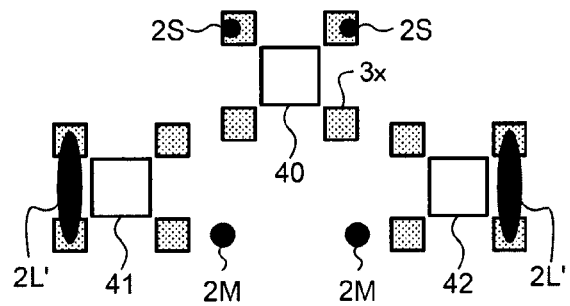
FIG. 7A to FIG. 7D are diagrams for explaining a resizing process of SRAFs according to a second embodiment.

As shown in FIG. 7A, in the mask pattern generating apparatus 1, grouping of undesired transfer patterns is performed for each size. In this example, the case is illustrated in which undesired transfer patterns are classified into the small undesired transfer pattern 2S, the moderate undesired transfer pattern 2M, and the large undesired transfer pattern 2L'.

Figure 7B:
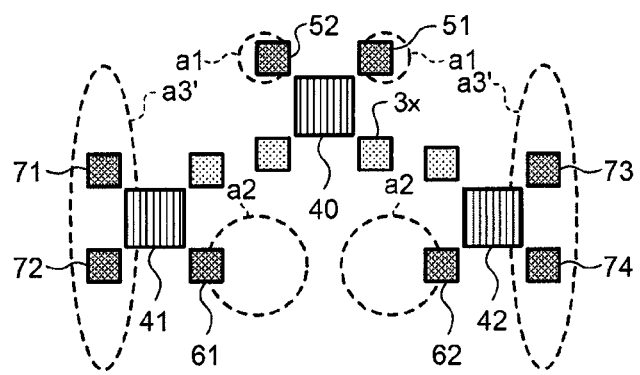

Thereafter, as shown in FIG. 7B, the resizing processing unit 16 selects resize target regions corresponding to each of the undesired transfer patterns 2S, 2M, and 2L'. This example illustrates the case where the regional is set as a resize target region corresponding to the undesired transfer pattern 2S, the region a2 is set as a resize target region corresponding to the undesired transfer pattern 2M, and the region a3' is set as a resize target region corresponding to the undesired transfer pattern 2L'. After setting the regions a1, a2, and a3', the resizing processing unit 16 selects the SRAFs 3× according to the regions a1, a2, and a3'.

Moreover, the resizing processing unit 16 selects the contact patterns 40 to 42 corresponding to the selected SRAFs 3×. These contact patterns 40 to 42 are patterns as a basis (source) for placing the selected SRAFs 3× and the SRAFs 3× are patterns placed for improving the NILS of the contact patterns 40 to 42. The SRAFs 3× are placed for each of the contact patterns 40 to 42, so that, in the present embodiment, the SRAFs 3× belonging to the selected contact patterns 40 to 42 are all selected.

In this example, the case is illustrated in which SRAFs 51 and 52 are selected as the SRAFs 3× corresponding to the regional. Moreover, the case is illustrated in which SRAFs 61 and 62 are selected as the SRAFs 3× corresponding to the region a2. Furthermore, the case is illustrated in which SRAFs 71 to 74 are selected as the SRAF 3× corresponding to the region a3'.

The resizing processing unit 16 selects the contact pattern 40 as a contact pattern corresponding to the SRAFs 51 and 52. Moreover, the resizing processing unit 16 selects the contact pattern 41 as a contact pattern corresponding to the SRAF 61 and selects the contact pattern 42 as a contact pattern corresponding to the SRAF 62. Furthermore, the resizing processing unit 16 selects the contact pattern 41 as a contact pattern corresponding to the SRAFs 71 and 72 and selects the contact pattern 42 as a contact pattern corresponding to the SRAFs 73 and 74.

Figure 7C:
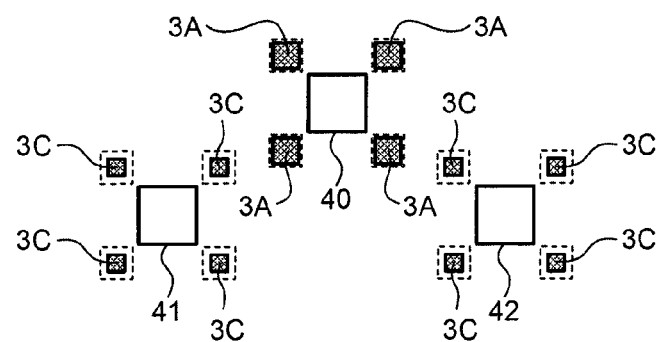

Thereafter, as shown in FIG. 7C, the resizing processing unit 16 resizes the SRAFs 3× for each of the selected contact patterns. For example, four SRAF 3× are selected as the SRAFs corresponding to the contact pattern 40. Then, each SRAF 3× is resized by a small amount according to the small undesired transfer pattern 2S to become four SRAFs 3A.

Moreover, four SRAFs 3× are selected as the SRAFs corresponding to the contact pattern 41 and each of the selected SRAFs 3× is resized by the same amount. In this example, the selected SRAFs 3× correspond to both the moderate undesired transfer pattern 2M and the large undesired transfer pattern 2L, so that the SRAFs 3× are resized by a large amount according to the large undesired transfer pattern 2L to become four SRAFs 3C.

Moreover, four SRAFs 3× are selected as the SRAFs corresponding to the contact pattern 42 and each of the selected SRAFs 3× is resized by the same amount. In this example, the selected SRAFs 3× correspond to both the moderate undesired transfer pattern 2M and the large undesired transfer pattern 2L, so that the SRAFs 3× are resized by a large amount according to the large undesired transfer pattern 2L to become four SRAFs 3C.

In this manner, among the four SRAFs 3× placed around each of the contact patterns 41 and 42, two of them belong to the large undesired transfer pattern 2L, one of them belongs to the moderate undesired transfer pattern 2M, and one of them is not a resize target. Even in such a case, in the present embodiment, the SRAFs 3× are resized uniformly by the largest resize amount.

In other words, in the present embodiment, the SRAFs 3× are resized by the same resize amount according to the larger resize amount. Therefore, for example, when the selected SRAF 3× corresponds to both the small undesired transfer pattern 2S and the moderate undesired transfer pattern 2M, the SRAF 3× is resized by the moderate amount according to the moderate undesired transfer pattern 2M.

Figure 7D:
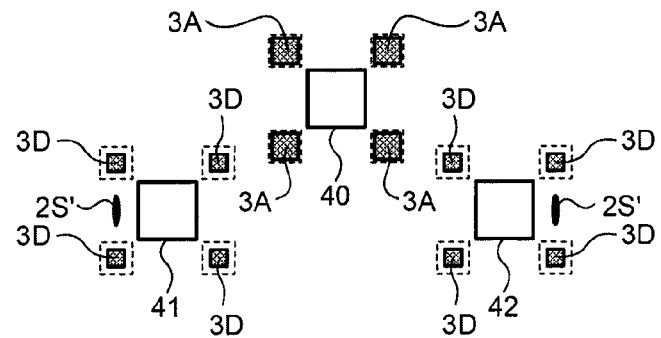

Thereafter, as shown in FIG. 7D, when an on-substrate pattern is formed by using a mask pattern after performing resizing of the SRAFs and the OPC process, if an undesired transfer pattern such as the undesired transfer pattern 2S' remains, the resizing processing unit 16 repeats the processes explained in FIG. 7A to FIG. 7C.

Figure 8:
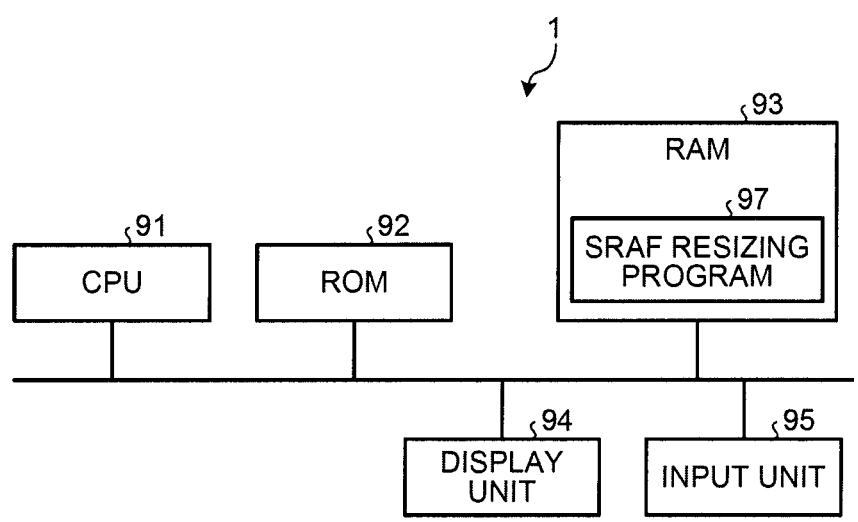
FIG. 8 is a diagram illustrating a hardware configuration of the mask pattern generating apparatus.

Next, the hardware configuration of the mask pattern generating apparatus 1 is explained. FIG. 8 is a diagram illustrating the hardware configuration of the mask pattern generating apparatus. The mask pattern generating apparatus 1 includes a CPU (Central Processing Unit) 91, a ROM (Read Only Memory) 92, a RAM (Random Access Memory) 93, a display unit 94, and an input unit 95. In the mask pattern generating apparatus 1, the CPU 91, the ROM 92, the RAM 93, the display unit 94, and the input unit 95 are connected via a bus line.

The CPU 91 performs determination of a pattern by using an SRAF resizing program 97 that is a computer program.

The display unit 94 is a display apparatus such as a liquid crystal monitor, and displays a layout pattern in which the SRAFs 3× are placed, a mask pattern after the OPC (before SRAF resizing), a mask pattern in which the SRAFs 3× are resized, the resize amount setting information, an undesired transfer pattern, a resist pattern (lithography simulation result), and the like based on an instruction from the CPU 91. The input unit 95 includes a mouse and a keyboard, and inputs instruction information (such as parameter necessary for resizing the SRAFs 3×) that is externally input by a user. The instruction information input to the input unit 95 is sent to the CPU 91.

The SRAF resizing program 97 is stored in the ROM 92 and is loaded in the RAM 93 via the bus line. FIG. 8 illustrates a state where the SRAF resizing program 97 is loaded in the RAM 93.

The CPU 91 executes the SRAF resizing program 97 loaded in the RAM 93. Specifically, in the mask pattern generating apparatus 1, the CPU 91 reads out the SRAF resizing program 97 from the ROM 92, loads it in a program storage area in the RAM 93, and executes various processes, in accordance with an instruction input by a user from the input unit 95. The CPU 91 temporarily stores various data generated in the various processes in a data storage area formed in the RAM 93.

The SRAF resizing program 97 executed in the mask pattern generating apparatus 1 has a module configuration including the resizing processing unit 16. These are loaded in a main storage device to be generated on the main storage device. The SRAF resizing program 97 may include functions of the OPC processing unit 12, the on-substrate-pattern-shape deriving unit 13, and the transfer determining unit 14.

In this manner, according to the first and second embodiments, a mask pattern from which a desired on-substrate pattern can be formed can be easily generated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of generating a mask pattern, comprising:
   extracting an undesired transfer pattern, which is transferred onto a substrate when an on-substrate pattern is formed on the substrate by using a mask pattern in which auxiliary patterns are placed; and
   correcting the mask pattern according to a size and a position of the undesired transfer pattern, including:
      extracting, from the mask pattern, one of the auxiliary patterns within a predetermined region surrounding the undesired transfer pattern, the predetermined region being determined according to the size of the undesired transfer pattern; and
      changing a size of the extracted auxiliary pattern according to the size of the undesired transfer pattern.

2. The method according to claim 1, wherein:
   the predetermined region is a circular region; and
   the undesired transfer pattern is at a center of the circular region.

3. The method according to claim 1, wherein the predetermined region has a shape according to a shape of the undesired transfer pattern.

4. The method according to claim 1, wherein the size of the extracted auxiliary pattern is changed in a range in which a predetermined lithography margin is capable of being ensured.

5. The method according to claim 1, wherein in a case where a plurality of auxiliary patterns is placed with respect to one main pattern among main patterns to be a circuit pattern when the on-substrate pattern is formed, a size of each of the auxiliary patterns is changed by a same resize amount.

6. The method according to claim 1, wherein the size of the extracted auxiliary pattern is changed based on a resize dimension according to the size of the undesired transfer pattern or a resize rate according to the size of the undesired transfer pattern.

7. The method according to claim 1, wherein if the extracted auxiliary pattern corresponds to a plurality of undesired transfer patterns, the extracted auxiliary pattern is changed to a size according to a size of one of the undesired transfer patterns for which a larger size changing is set among the undesired transfer patterns.

8. A computer program product that is executable in a computer and includes a computer-readable recording medium including a plurality of instructions for correcting a mask pattern, the instructions causing the computer to execute:
  extracting an undesired transfer pattern that is transferred onto a substrate when an on-substrate pattern is formed on the substrate by using a mask pattern in which auxiliary patterns are placed; and
  correcting the mask pattern according to a size and a position of the undesired transfer pattern, including:
    extracting, from the mask pattern, one of the auxiliary patterns within a predetermined region surrounding the undesired transfer pattern, the predetermined region being determined according to the size of the undesired transfer pattern; and
    changing a size of the extracted auxiliary pattern according to the size of the undesired transfer pattern.

9. The computer program product according to claim 8, wherein:
  the predetermined region is a circular region; and
  the undesired transfer pattern being at a center of the circular region.

10. The computer program product according to claim 8, wherein the predetermined region has a shape according to a shape of the undesired transfer pattern.

* * * * *